(12) United States Patent
Kim

(10) Patent No.: US 11,342,345 B2
(45) Date of Patent: May 24, 2022

(54) ELECTRONIC DEVICE AND METHOD FOR FABRICATING THE SAME

(71) Applicant: SK hynix Inc., Icheon (KR)

(72) Inventor: Hwang Yeon Kim, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/932,315

(22) Filed: Jul. 17, 2020

(65) Prior Publication Data

US 2021/0296329 A1 Sep. 23, 2021

(30) Foreign Application Priority Data

Mar. 18, 2020 (KR) ........................ 10-2020-0033190

(51) Int. Cl.
*G11C 16/04* (2006.01)
*H01L 27/11512* (2017.01)
*H01L 27/11507* (2017.01)
*H01L 27/11585* (2017.01)

(52) U.S. Cl.
CPC .. *H01L 27/11512* (2013.01); *H01L 27/11507* (2013.01); *H01L 27/11585* (2013.01)

(58) Field of Classification Search
CPC ......... H01L 27/11512; H01L 27/11507; H01L 27/11585
See application file for complete search history.

(56) References Cited

U.S. PATENT DOCUMENTS

| 8,027,188 B2 * | 9/2011 | Nagashima | G11C 13/0004 |
| | | | 365/163 |
| 9,214,228 B1 * | 12/2015 | Okawa | G11C 11/16 |
| 10,861,503 B1 * | 12/2020 | Kim | H01L 27/228 |

FOREIGN PATENT DOCUMENTS

KR 1020150135804 A 12/2015

* cited by examiner

*Primary Examiner* — Pho M Luu

(57) ABSTRACT

An electronic device including a semiconductor memory is provided. The semiconductor memory includes a plurality of first lines extending in a first direction; a plurality of second lines disposed over the first lines, the second lines extending in a second direction crossing the first direction; a plurality of memory cells disposed between the first lines and the second lines at intersection regions of the first lines and the second lines; first liner layer patterns positioned on both sidewalls of each memory cell in the second direction; a first insulating layer pattern positioned between adjacent first liner layer patterns in the second direction; second liner layer patterns positioned on both sidewalls of each memory cell in the first direction; a second insulating layer pattern positioned between adjacent second liner layer patterns in the first direction; and a third insulating layer positioned between adjacent second liner layer patterns in the second direction.

20 Claims, 23 Drawing Sheets

ELECTRONIC DEVICE AND METHOD FOR FABRICATING THE SAME

CROSS-REFERENCE TO RELATED APPLICATIONS

The present application claims priority of Korean Patent Application No. 10-2020-0033190, filed on Mar. 18, 2020, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that switches between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes various embodiments of an electronic device capable of facilitating processes and improving operating characteristics, and a method for fabricating the same.

In an embodiment, an electronic device includes a semiconductor memory, which includes: a plurality of first lines extending in a first direction; a plurality of second lines disposed over the first lines, the second lines extending in a second direction crossing the first direction; a plurality of memory cells disposed between the first lines and the second lines at intersection regions of the first lines and the second lines; first liner layer patterns positioned on both sidewalls of each memory cell in the second direction; a first insulating layer pattern positioned between adjacent first liner layer patterns in the second direction; second liner layer patterns positioned on both sidewalls of each memory cell in the first direction; a second insulating layer pattern positioned between adjacent second liner layer patterns in the first direction; and a third insulating layer positioned between adjacent second liner layer patterns in the second direction.

In another embodiment, a method for fabricating an electronic device comprising a semiconductor memory, includes: forming a plurality of stacked structures extending in a first direction over a substrate, each of the stacked structures including a first line and an initial memory cell; forming first liner layers over both sidewalls of the stacked structure in a second direction crossing the first direction; forming a first insulating layer between the first liner layers; forming a plurality of second lines extending in the second direction over the stacked structures, the first liner layers and the first insulating layer; etching the initial memory cell, the first liner layers, and the first insulating layer exposed by the second lines to form memory cells, first liner layer patterns, and first insulating layer patterns; forming second liner layers over both sidewalls of each of the memory cells, each of the first liner layer patterns, and each of the first insulating layer patterns in the first direction; forming a second insulating layer between the second liner layers; and forming a hole for removing a portion of the second liner layer between the memory cells in the second direction to form a plurality of second liner layer patterns separated from each other in the second direction.

These and other aspects, embodiments and associated advantages are described in greater detail in the drawings, the description and the claims.

DETAILED DESCRIPTION

Figure 1A:
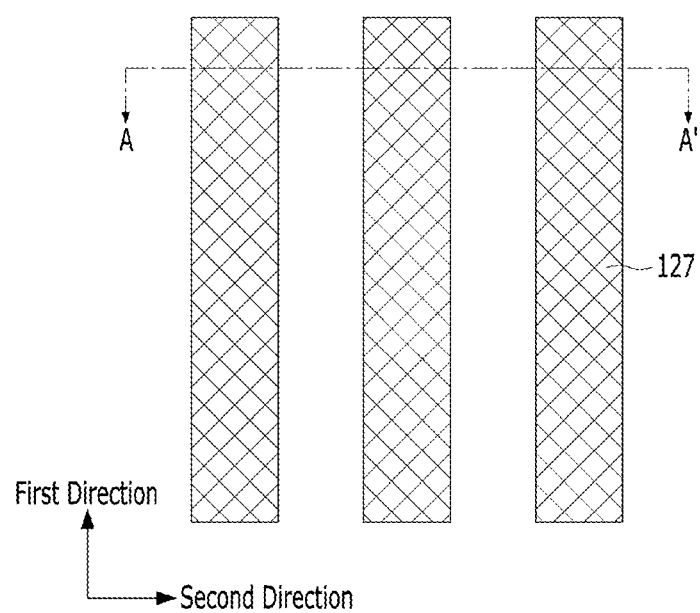
FIGS. 1A, 1B, 2A, 2B, 3A, 3B, 4A, 4B, 5A, 5B, 6A, 6B, 7A, 7B, 8A and 8B are views illustrating a memory device according to an embodiment of the present disclosure, and a method for fabricating the same.

Various examples and embodiments of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or embodiments. In presenting a specific example in a drawing or description having two or more layers in a multi-layer structure, the relative positioning relationship of such layers or the sequence of arranging the layers as shown reflects a particular embodiment for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Before describing embodiments, a memory device to which the embodiments can be applied will be briefly described.

The embodiments can be applied to a memory device in which memory cells are arranged at intersections between lower lines and upper lines that cross each other.

Here, the memory cell may require heat or generate heat during operation of the memory device. For example, the memory cell may include a phase change material. For reference, the phase change material may be switched between an amorphous state and a crystalline state by Joule heat generated according to a current flowing therethrough. When the phase change material is in an amorphous state, the phase change material may be in a relatively high resistance state, and when the phase change material is in a crystalline state, the phase change material may be in a relatively low resistance state. Data may be stored in the memory cell using the difference in resistance of the phase change material.

However, heat from a memory cell may be transferred to the surroundings and cause a thermal disturbance phenomenon that affects the phase change material of adjacent memory cells. Due to the thermal disturbance phenomenon, an error may occur in the operation of the memory device, and accordingly, reliability of the memory device may be deteriorated.

Furthermore, the heat generated for the state change of the phase change material may be lost to the surroundings, so a current required for the state change of the phase change material, in particular, a reset current, may increase.

Hereinafter, a memory device and a method for manufacturing the same capable of reducing heat transfer and/or heat loss to the surroundings during operation of the memory device, will be proposed.

Figure 6A:
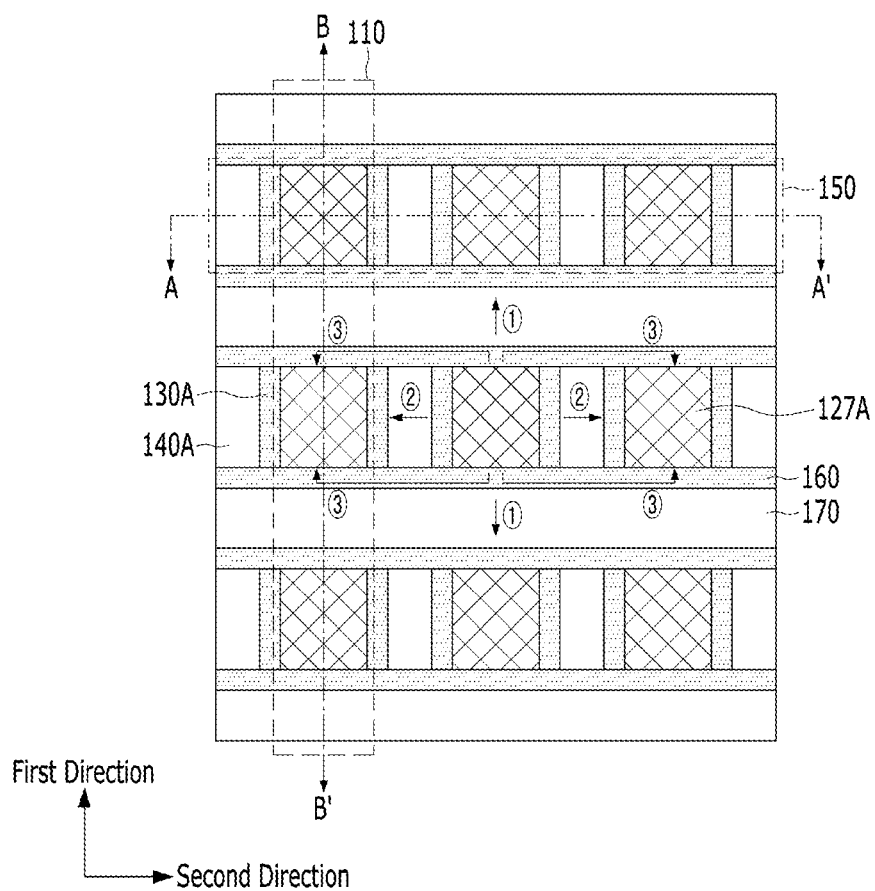
Figure 6B:
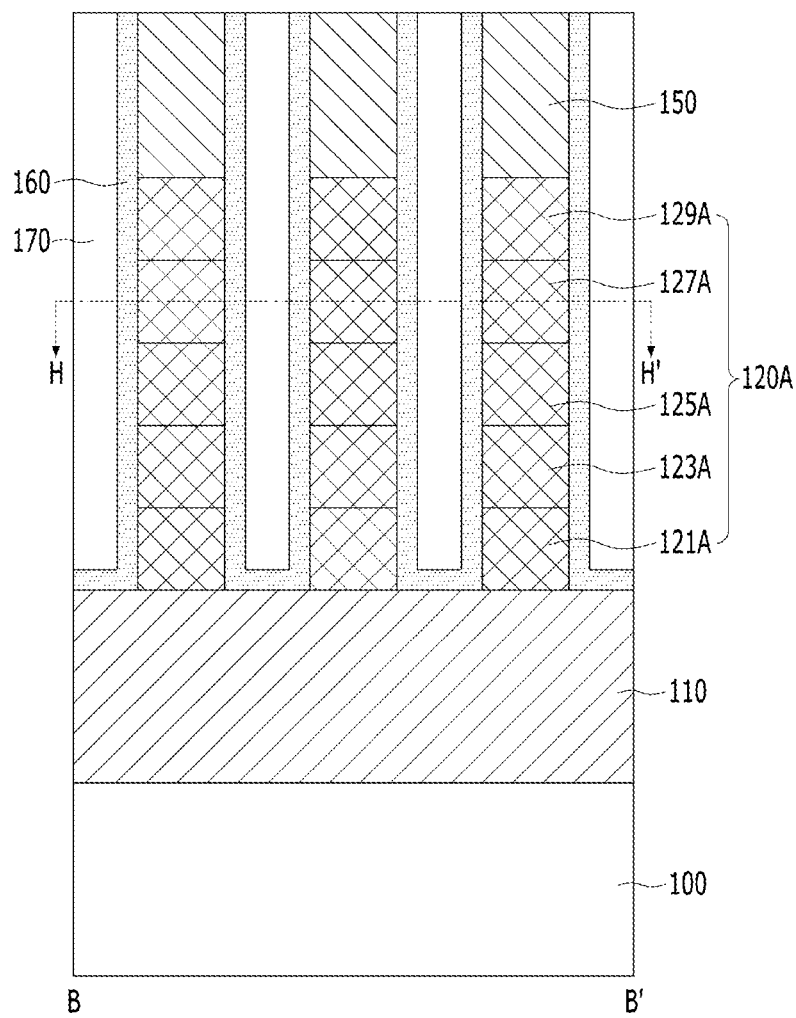
Figure 7A:
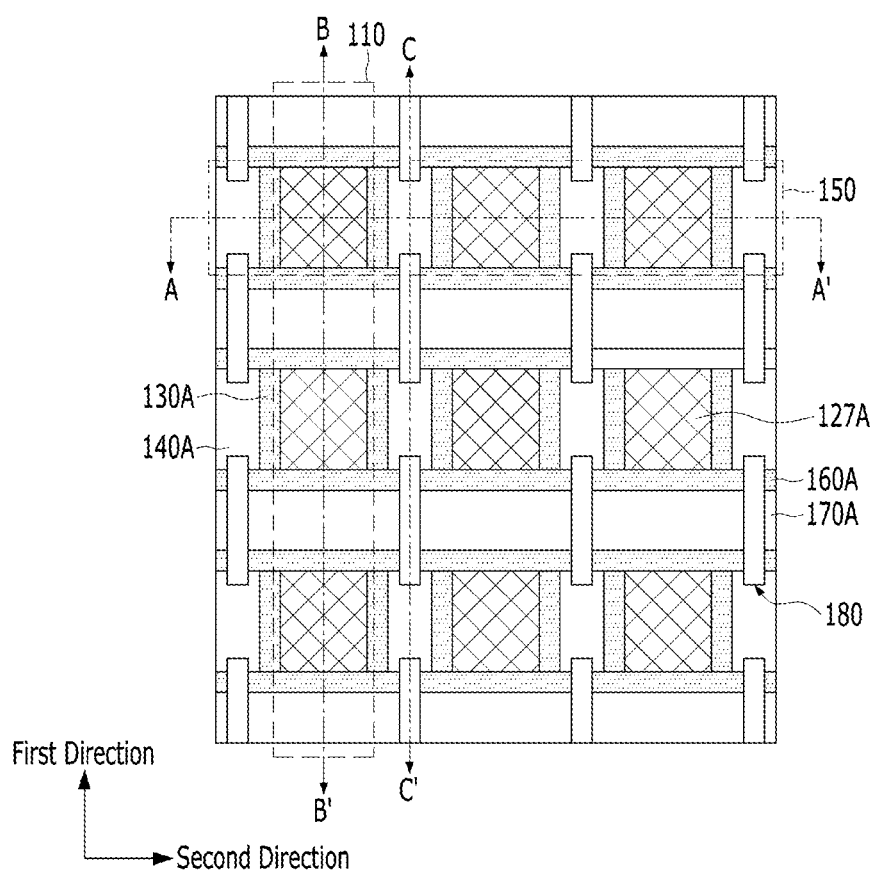
Figure 7B:
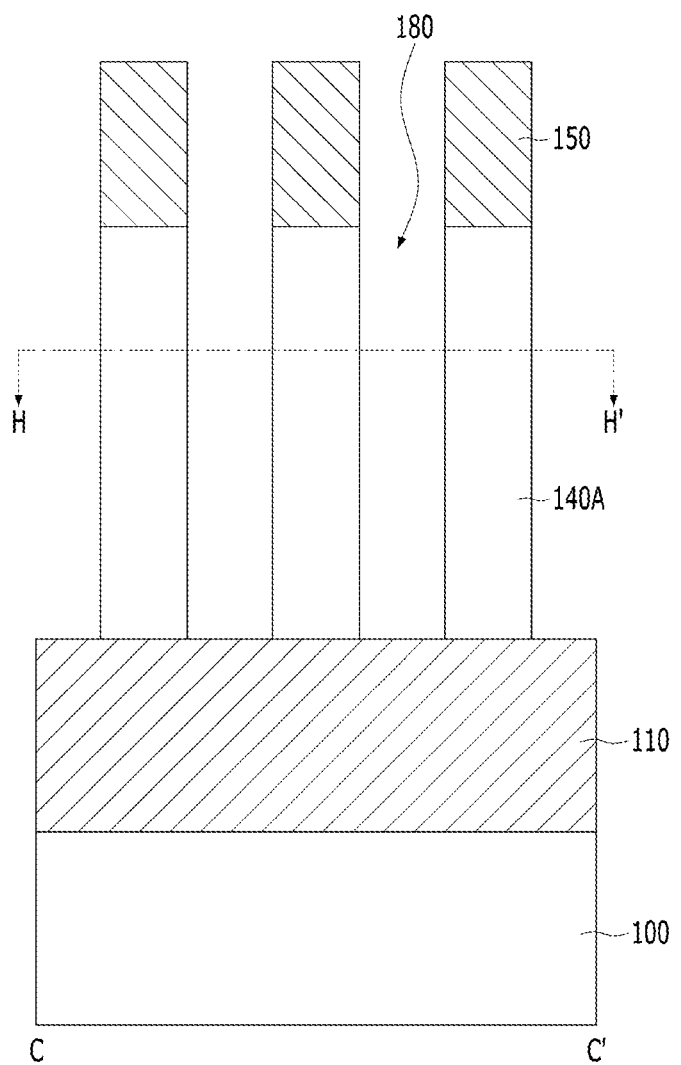
Figure 8A:
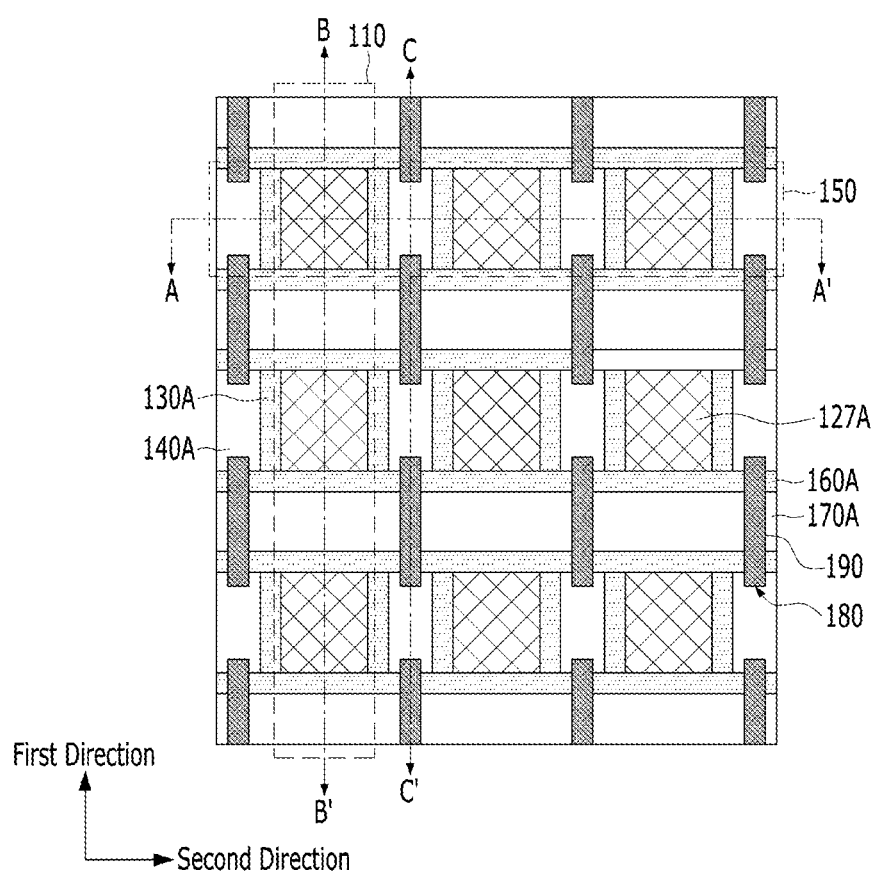
Figure 8B:
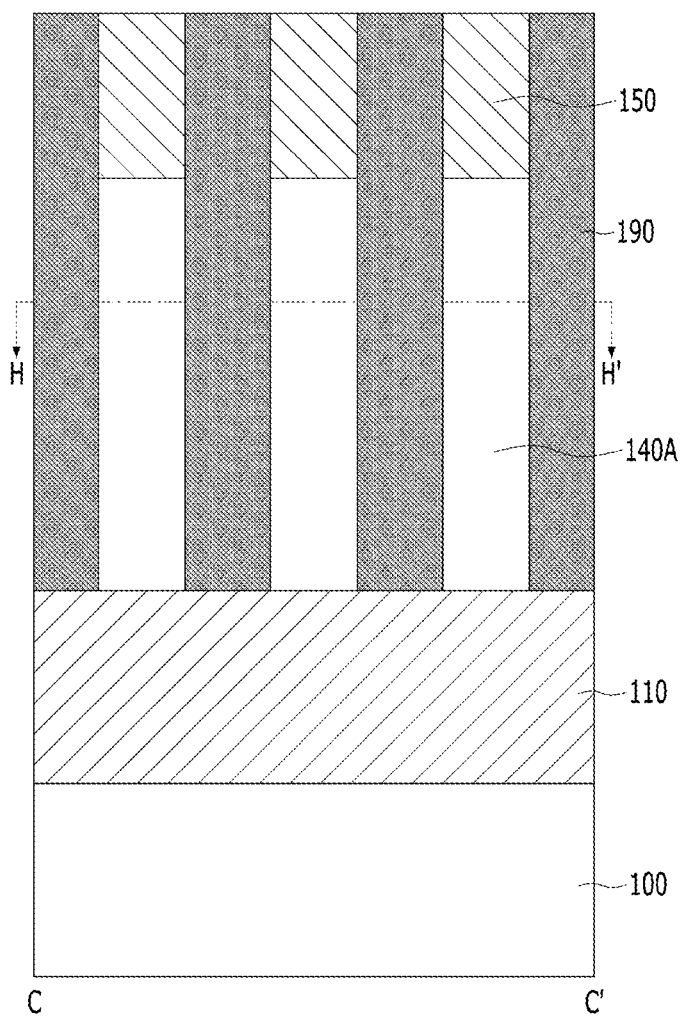

FIGS. 1A to 8B are views illustrating a memory device according to an embodiment of the present disclosure, and a method for fabricating the same. FIGS. 1A, 2A, 3A, 4A, 5A, 6A, 7A, and 8A are plan views. FIGS. 1B, 2B, and 3B are cross-sectional views taken along lines A-A' of FIGS. 1A, 2A, and 3A, respectively. FIGS. 4B, 5B, and 6B are cross-sectional views taken along lines B-B' of FIGS. 4A, 5A, and 6A, respectively. FIGS. 7B and 8B are cross-sectional views taken along lines C-C' of FIGS. 7A and 8A, respectively. FIGS. 1A, 2A, 3A, 4A, 5A, 6A, 7A and 8A are shown at a height of a line H-H' of FIGS. 1B, 2B, 3B, 4B, 5B, 6B, 7B and 8B, respectively.

First, a fabricating method will be described.

Figure 1B:
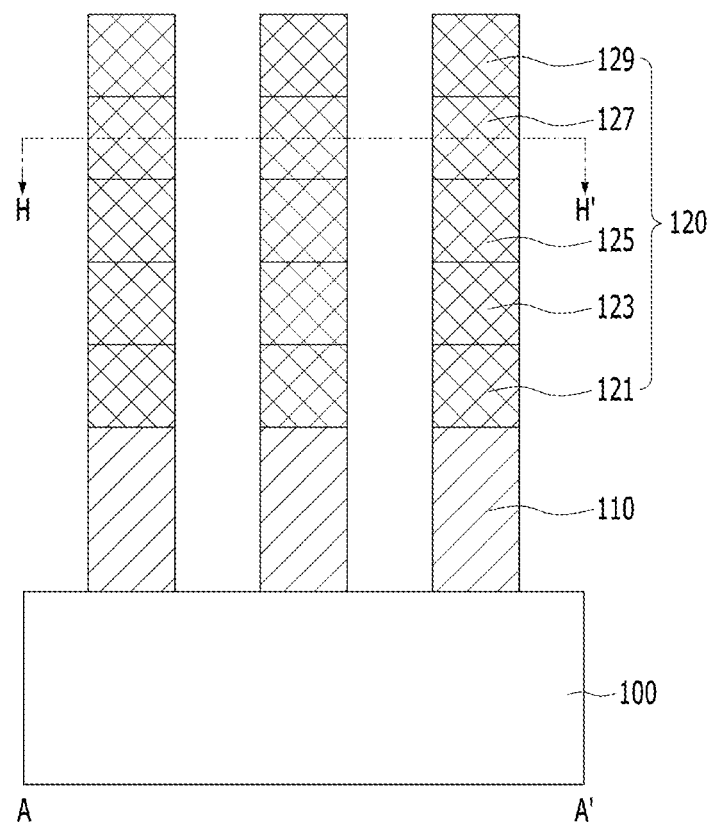

Referring to FIGS. 1A and 1B, a substrate 100 may be provided. The substrate 100 may include a semiconductor material such as silicon. In addition, a lower structure (not shown) may be formed in the substrate 100. For example, the substrate 100 may include transistors which are electrically coupled to first lines 110 and/or second lines (see 150 of FIG. 4B) and control supply of a current or voltage, or the like.

Subsequently, a stacked structure 110 and 120 in which a first line 110 and an initial memory cell 120 are stacked may be formed over the substrate 100. The stacked structure 110 and 120 may have a line shape extending in a first direction. A plurality of stacked structures 110 and 120 may be arranged to be spaced apart from each other in a second direction substantially perpendicular to the first direction. The stacked structures 110 and 120 may be formed by forming a conductive layer for the first line 110 and one and more material layers for the initial memory cell 120 over the substrate 100, and etching the conductive layer and the material layers using a line-shaped mask pattern (not shown) extending in the first direction.

The first line 110 may be coupled to a lower end of the initial memory cell 120 to supply a current or voltage. The first line 110 may have a single-layered structure or a multi-layered structure including a conductive material such as a metal, a metal nitride, or the like. The first line 110 may function as a word line or a bit line.

The initial memory cell 120 may be additionally patterned in a subsequent process to be transformed into a memory cell (see 120A of FIG. 4B, etc.), and may store data. In particular, the initial memory cell 120 may include a variable resistance element capable of storing data by switching between different resistance states according to a current or voltage supplied through its upper and lower ends.

As an example, the initial memory cell 120 may include an initial lower electrode layer 121, an initial selection element layer 123, an initial intermediate electrode layer 125, an initial variable resistance layer 127, and an initial upper electrode layer 129.

The initial lower electrode layer 121 may be disposed at the bottom of the initial memory cell 120 to provide a connection between the initial memory cell 120 and the first line 110. The initial lower electrode layer 121 may have a single-layered structure or a multi-layered structure including a low-resistance conductive material such as a metal, a metal nitride, or the like.

The initial selection element layer 123 may have a threshold switching characteristic for blocking or only allowing a small amount of current when a magnitude of an applied voltage is less than a predetermined threshold voltage and for allowing a current to abruptly increase above the threshold voltage. Therefore, the initial selection element layer 123 may control access to the initial variable resistance layer 127. The initial selection element layer 123 may include a diode, an OTS (Ovonic Threshold Switching) material such as a chalcogenide material, an MIEC (Mixed Ionic Electronic Conducting) material such as a metal containing chalcogenide material, an MIT (Metal Insulator Transition) material such as $NbO_2$, $VO_2$, or the like, or a tunneling insulating material having a relatively wide band gap such as $SiO_2$, $Al_2O_3$, or the like.

The initial intermediate electrode layer 125 may physically separate the initial selection element layer 123 and the initial variable resistance layer 127 while electrically connecting them. The initial intermediate electrode layer 125 may have a single-layered structure or a multi-layered structure including a low-resistance conductive material such as a metal, a metal nitride, or the like.

The initial variable resistance layer 127 may have a variable resistance characteristic that switches between different resistance states depending on a current or voltage supplied to its upper and lower ends, to store data. The initial variable resistance layer 127 may have a single-layered structure exhibiting a variable resistance characteristic alone or a multi-layered structure exhibiting a variable resistance characteristic by a combination of two or more layers. As an example, the initial variable resistance layer 127 may include a phase change material that switches between an amorphous state and a crystalline state by Joule heat generated according to a current flowing therethrough. However, the present disclosure is not limited thereto. In another embodiment, the initial variable resistance layer 127 may have a single-layered structure or a multi-layered structure including at least one of materials used for an RRAM, a PRAM, an MRAM, an FRAM, or the like, that is, a metal oxide such as a perovskite-based oxide, a transition metal oxide, or the like, a phase change material such as a chalcogenide-based material, a ferromagnetic material, a ferroelectric material, or the like. Even if the initial variable resistance layer 127 of this embodiment is not a phase change material, this embodiment may be applied to reduce or block heat transfer between memory cells.

The initial upper electrode layer 129 may be disposed at the top of the initial memory cell 120 to provide a connection between the initial memory cell 120 and the second line to be described later. The initial upper electrode layer 129 may have a single-layered structure or a multi-layered structure including a low-resistance conductive material such as a metal, a metal nitride, or the like.

However, the layered-structure of the initial memory cell 120 may vary between different embodiments. As an example, the initial memory cell 120 may further include one or more layers (not shown) in addition to the layers 121, 123, 125, 127, and 129, to improve data storing characteristics or processes. Alternatively, at least one of the initial lower electrode layer 121, the initial selection element layer 123, the initial intermediate electrode layer 125, and the initial upper electrode layer 129 may be omitted. Alternatively, locations of the initial variable resistance layer 127 and the initial selection element layer 123 may be reversed with respect to a vertical orientation.

Figure 2A:
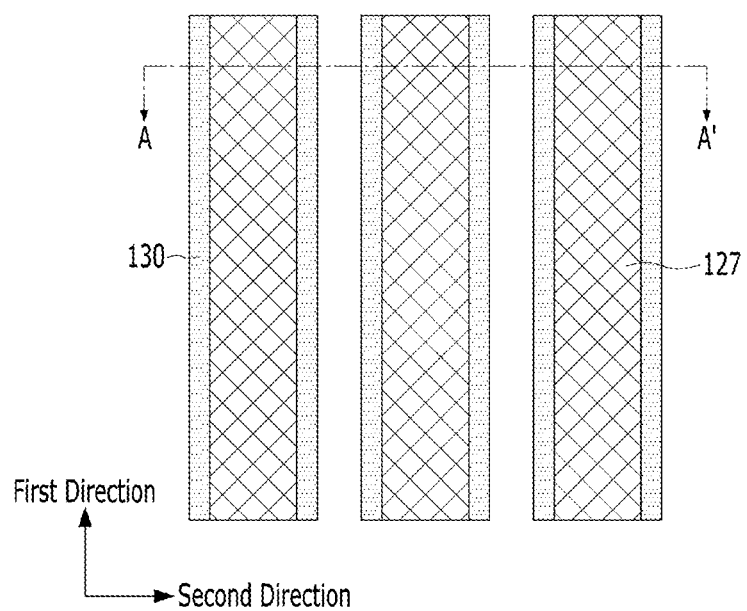
Figure 2B:
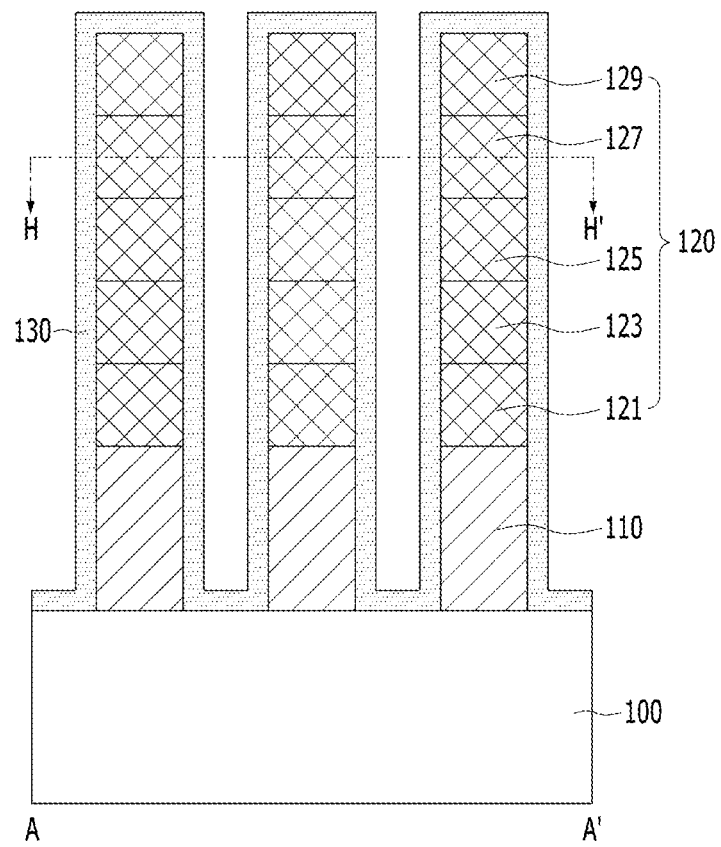

Referring to FIGS. 2A and 2B, a first liner layer 130 may be formed along entire surfaces of the stacked structures 110 and 120. The first liner layer 130 may be sufficiently thin so that that does not completely fill a space between the stacked structures 110 and 120 in the second direction.

The first liner layer 130 may function to protect the initial memory cell 120 in a subsequent process. As an example, in a process of forming an insulating material filling a space between the initial memory cells 120, the first liner layer 130 may prevent oxidation of the initial memory cells 120. In this case, the first liner layer 130 may include silicon nitride containing silicon and nitrogen. This silicon nitride may further contain other elements in addition to silicon and nitrogen. For example, the first liner layer 130 may include SiN, SiCN, or the like. However, the present disclosure is not limited thereto, and the first liner layer 130 may have a single-layered structure or a multi-layered structure including various insulating materials.

Figure 3A:
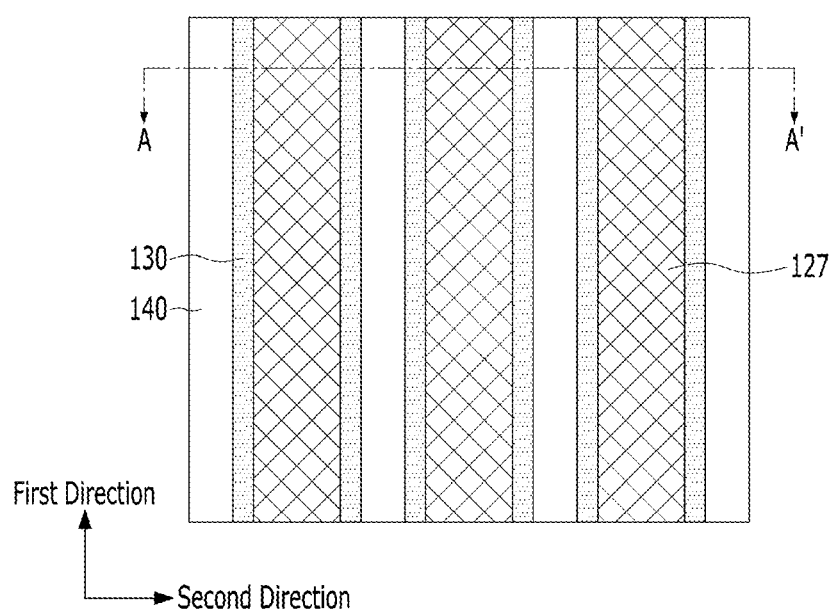
Figure 3B:
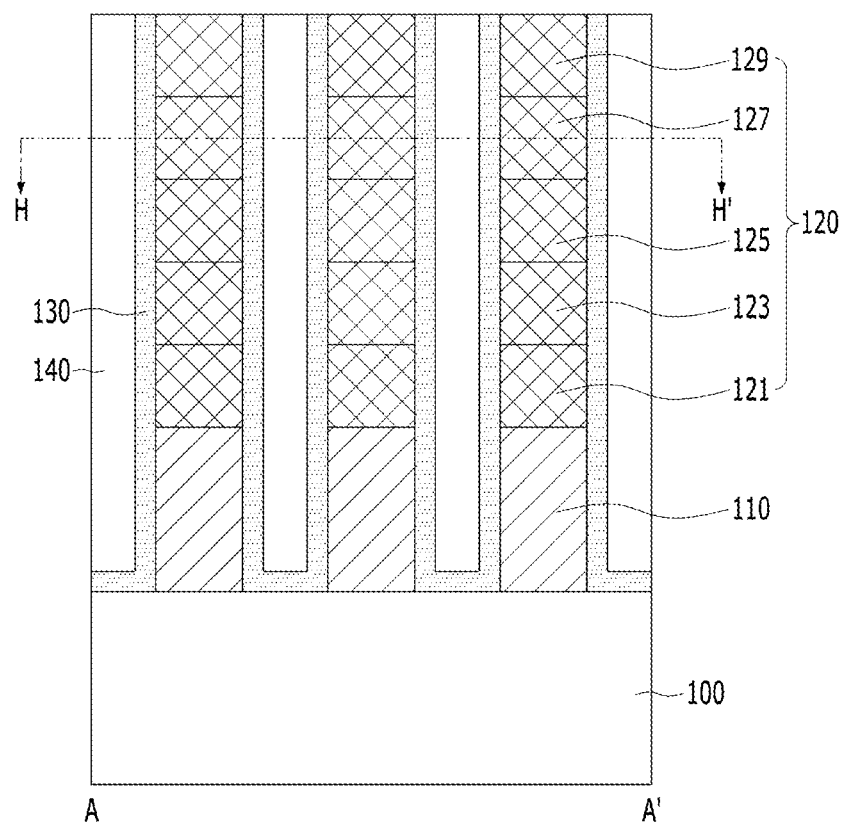

Referring to FIGS. 3A and 3B, a first insulating layer 140 filling a space between the first liner layers 130 in the second direction may be formed.

The first insulating layer 140 may be formed by forming an insulating material having a thickness sufficient to fill the spaces between the first liner layers 130 over the resultant structure of FIGS. 2A and 2B, and then performing a planarization process, for example, a chemical mechanical polishing (CMP) process, until an upper surface of the initial memory cell 120, for example, an upper surface of the initial upper electrode layer 129 is exposed. In this planarization process, the first liner layer 130 may be planarized together with the insulating material. Accordingly, an upper surface of the first insulating layer 140, an upper surface of the first liner layer 130, and the upper surface of the initial memory cell 120 may form a substantially flat surface. Furthermore, the insulating material for forming the first insulating layer 140 may be a flowable material. When the aspect ratio of the space between the first liner layers 130 is large, the space is easily filled using the flowable material. When the insulating material is flowable, a curing process may be additionally performed after forming the insulating material.

Here, the first insulating layer 140 may include a material having a low thermal conductivity, that is, a low-K material to prevent heat loss from the initial memory cell 120, particularly from the initial variable resistance layer 127, or heat transfer between the initial memory cells 120, particularly between the initial variable resistance layers 127. For example, the first insulating layer 140 may include a material having a K value of less than 0.04 W/mK. As an example, the first insulating layer 140 may include SiOC, and further include impurities such as hydrogen (H), nitrogen (N), or the like. A thermal conductivity of the first insulating layer 140 may be lower than a thermal conductivity of the first liner layer 130.

Figure 4A:
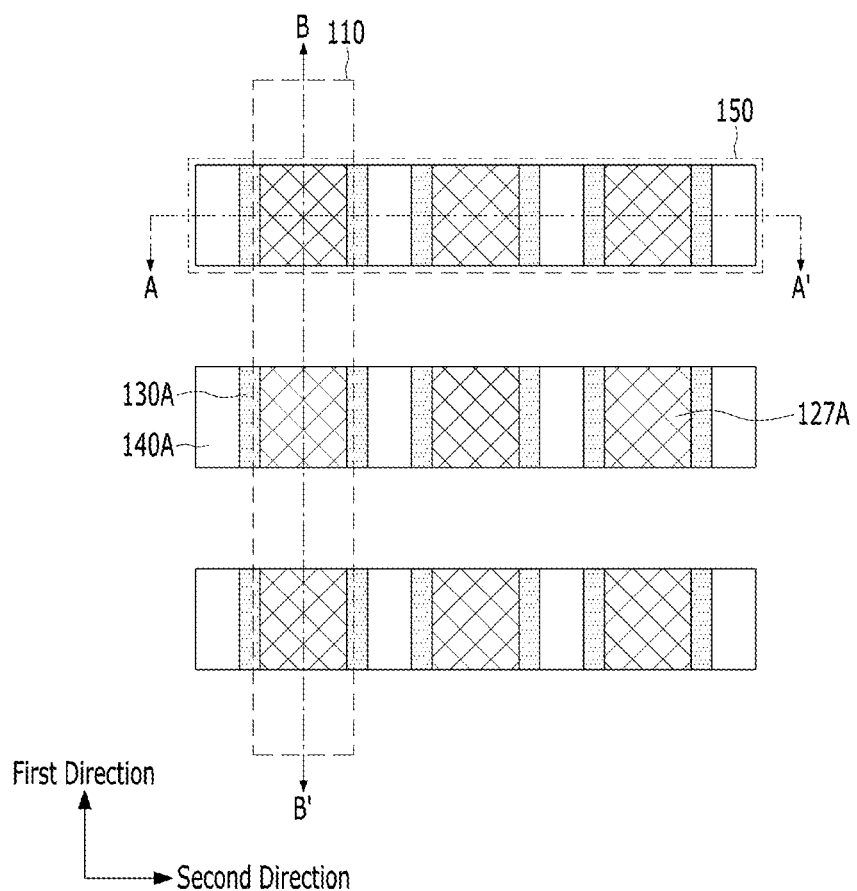
Figure 4B:
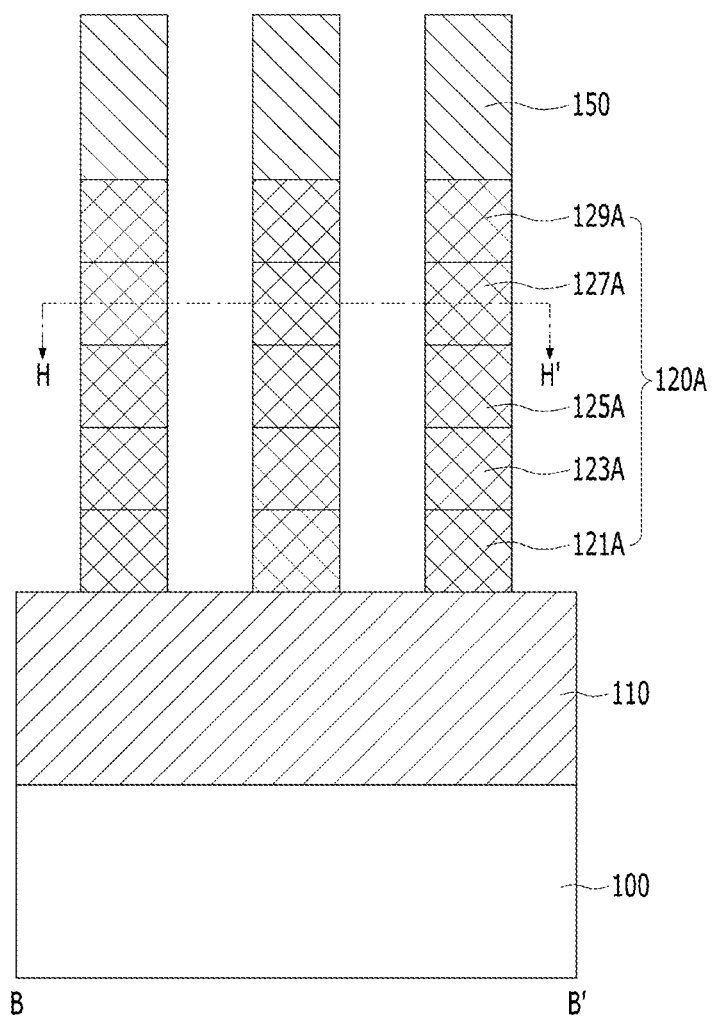

Referring to FIGS. 4A and 4B, second lines 150 and memory cells 120A may be formed. The second lines 150 and the memory cells 120A may be formed by depositing a conductive layer for forming the second lines 150 over the resultant structure of FIGS. 3A and 3B, etching portions of the conductive layer using a mask pattern extending in the second direction as an etching barrier to form the second lines 150, and etching the initial memory cell 120 exposed by the second lines 150. When the initial memory cell 120 is etched, the first liner layer 130 and the first insulating layer 140 exposed by the second lines 150 may also be etched. The etched initial memory cell, the etched first liner layer, and the etched first insulating layer will be referred to as a memory cell 120A, a first liner layer pattern 130A, and a first insulating layer pattern 140A, respectively. For reference, a cross-sectional view along the line A-A' of FIG. 4A is similar to the cross-sectional view of FIG. 3B. In addition, although FIG. 4A is illustrated at the height of the line H-H' of FIG. 4B, the first lines 110 and the second lines 150 are illustrated by dotted lines in FIG. 4A for convenience of explanation.

The second line 150 may have a line shape extending in the second direction. In addition, a plurality of second lines 150 may be spaced apart from each other in the first direction. The second line 150 may be coupled to an upper end of the memory cell 120A and transmit a current or voltage to the memory cell 120A together with the first line 110. The second line 150 may have a single-layered structure or a multi-layered structure including a conductive material such as a metal, a metal nitride, or the like. When the first line 110 functions as a word line, the second line 150 may function as a bit line. When the first line 110 functions as a bit line, the second line 150 may function as a word line.

The memory cells 120A may be disposed between the first lines 110 and the second lines 150 at intersection regions of the first lines 110 and the second lines 150. In a plan view, the memory cells 120A may have an island shape and be arranged as a matrix along the first direction and the second direction. Both sidewalls of the memory cell 120A in the first direction may be aligned with the second line 150, and both sidewalls of the memory cell 120A in the second direction may be aligned with the first line 110.

The memory cell 120A may include a stacked structure of a lower electrode layer 121A, a selection element layer 123A, an intermediate electrode layer 125A, a variable resistance layer 127A, and an upper electrode layer 129A.

The first liner layer patterns 130A may be located on both sidewalls of the memory cell 120A in the second direction, and the first insulating layer pattern 140A may be located between the first liner layer patterns 130A in the second direction.

Accordingly, the second lines 150 extending in the second direction and spaced apart from each other in the first direction may be formed. Also, the memory cells 120A, the first liner layer patterns 130A and the first insulating layer patterns 140A which are arranged in the second direction and overlap each of the second lines 150 below each of the second lines 150, may be formed.

Figure 5A:
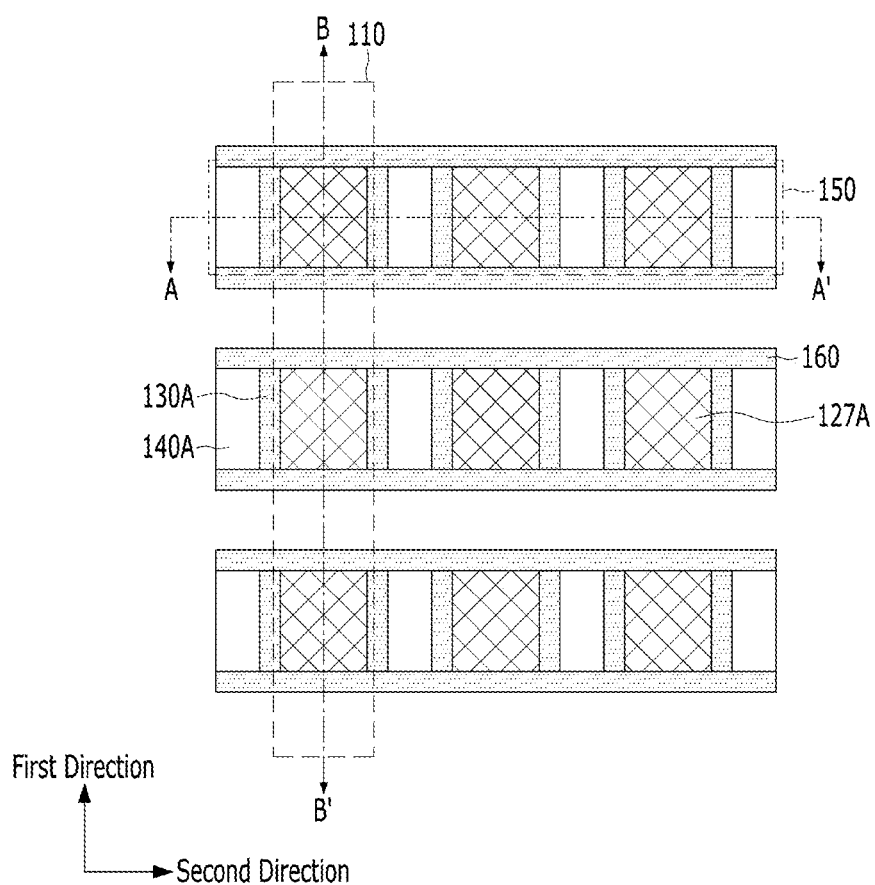
Figure 5B:
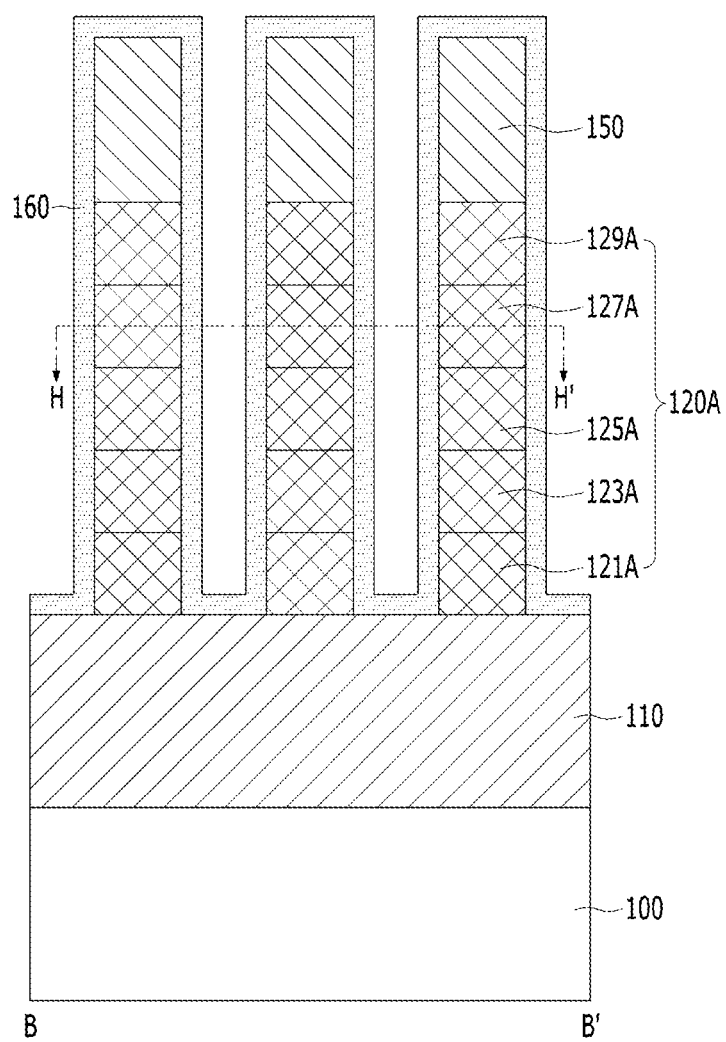

Referring to FIGS. 5A and 5B, a second liner layer 160 may be formed along entire surfaces of the resultant structure of FIGS. 4A and 4B. That is, the second liner layer 160 may be formed over sidewalls and upper surfaces of the stacked structures 120A, 130A, 140A, and 150. The second liner layer 160 may be sufficiently thin so that it does not completely fill a space between the stacked structures 120A, 130A, 140A, and 150 in the first direction. For reference, the cross-sectional view along the line A-A' of FIG. 5A is similar to the cross-sectional view of FIG. 3B.

The second liner layer 160 may function to protect the memory cell 120A in a subsequent process. As an example, in a process of forming an insulating material filling a space between the memory cells 120A in the first direction, the second liner layer 160 may prevent oxidation of the memory cells 120A. In this case, the second liner layer 160 may include silicon nitride containing silicon and nitrogen. This silicon nitride may further contain other elements in addition to silicon and nitrogen. For example, the second liner layer 160 may include SiN, SiCN, or the like. However, the present disclosure is not limited thereto, and the second liner layer 160 may have a single-layered structure or a multi-layered structure including various insulating materials. The second liner layer 160 may be formed of the same material as the first liner layer 130.

Referring to FIGS. 6A and 6B, a second insulating layer 170 filling a space between the second liner layers 160 in the first direction may be formed. For reference, a cross-sectional view along the line A-A' of FIG. 6A is similar to the cross-sectional view of FIG. 3B.

The second insulating layer 170 may be formed by forming an insulating material having a thickness sufficient to fill the space between the second liner layers 160 of the resultant structure of FIGS. 5A and 5B, and then, performing a planarization process, for example, a chemical mechanical polishing (CMP) process, until an upper surface of the second line 150 is exposed. In this planarization process, the second liner layer 160 may also be planarized together with the insulating material. Accordingly, an upper surface of the second insulating layer 170, an upper surface of the second liner layer 160, and the upper surface of the second line 150 may form a substantially flat surface. Furthermore, the insulating material for forming the second insulating layer 170 may be a flowable material. When the insulating material is flowable, a curing process may be additionally performed after forming the insulating material.

Here, the second insulating layer 170 may include a material having a low thermal conductivity, that is, a low-K material to prevent heat loss from the memory cell 120A, particularly from the variable resistance layer 127A, or heat transfer between the memory cells 120A, particularly between the variable resistance layers 127A. For example, the second insulating layer 170 may include a material having a K value of less than 0.04 W/mK. As an example, the second insulating layer 170 may include SiOC, and further include impurities such as hydrogen (H), nitrogen (N), or the like. A thermal conductivity of the second insulating layer 170 may be lower than a thermal conductivity of the second liner layer 160. The second insulating layer 170 may be formed of the same material as the first insulating layer 140.

Meanwhile, when the memory device shown in FIGS. 6A and 6B is operated, heat loss/transfer from the memory cell 120A, particularly from the variable resistance layer 127A, to the surroundings will be described with reference to the plan view of FIG. 6A.

Referring to FIG. 6A, in an embodiment in which 9 variable resistance layers 127A arranged in a 3*3 matrix, a resistance state of a central one of the variable resistance layers 127A may change, thereby generating heat from the variable resistance layer of the central memory cell. Under these circumstances, a heat loss path or a heat transfer path from the central variable resistance layer 127A to adjacent variable resistance layers 127A in the first direction is indicated by an arrow ①. In addition, a heat loss path or a heat transfer path from the central variable resistance layer 127A to adjacent variable resistance layers 127A in the second direction is indicated by arrows ② and ③. Referring to arrow ①, the heat loss path/heat transfer path in the first direction may be through the second liner layer 160 and the second insulating layer 170. On the other hand, in the second direction, the heat loss path/the heat transfer path may be not only through the first liner layer pattern 130A and the first insulating layer pattern 140A as shown by arrow ②, but also through the second liner layer 160 as shown by arrow ③. This is because the second liner layer 160 extends in the second direction while being disposed on both sidewalls of the memory cell 120A in the first direction.

The heat loss path/the heat transfer path indicated by arrows ① and ② may be effectively blocked because the first insulating layer pattern 140A and the second insulating layer 170 have a low thermal conductivity. On the other hand, it may be difficult to block the heat loss path/heat transfer path indicated by arrow ③. Accordingly, the degree of heat loss/heat transfer in the second direction may be greater than the degree of heat loss/heat transfer in the first direction. Therefore, an overall degree of heat loss/heat transfer may be reduced by reducing the degree of heat loss/heat transfer in the second direction to a degree similar to the degree of heat loss/heat transfer in the first direction. To this end, the processes of FIGS. 7A to 8B described below may be performed.

Referring to FIGS. 7A and 7B, a part of the second liner layer 160 may be removed to form a plurality of second liner layer patterns 160A separated from each other in the second direction. For reference, a cross-sectional view along the line A-A' of FIG. 7A is similar to the cross-sectional view of FIG. 3B, and a cross-sectional view along the line B-B' of FIG. 7A is similar to the cross-sectional view of FIG. 6B, and are omitted.

The second liner layer patterns 160A may be formed by forming a mask pattern exposing at least a portion of the second liner layer 160, which corresponds to a region between the adjacent memory cells 120A in the second direction, over the resultant structure of FIGS. 6A and 6B, and then, removing the portion of the second liner layer 160 exposed by the mask pattern. A space formed by the removed portion of the second liner layer 160 is hereinafter referred to as a hole 180. The plurality of second liner layer patterns 160A may be separated from each other in the second direction by holes 180. Thus, the second liner layer patterns 160A may be located on both sidewalls of the memory cell 120A in the first direction. The second liner layer pattern 160A positioned on sidewalls of a first memory cell 120A and the second liner layer pattern 160A positioned on sidewalls of a second memory cell 120A which is adjacent to the first memory cell in the second direction may be separated and spaced apart from each other. Thus, the heat loss path/heat transfer path indicated by arrow ③ in FIG. 6A may be blocked. Accordingly, the degree of heat loss/heat transfer in the second direction may be reduced, and the degree of heat loss/heat transfer in the first direction may be the same as or similar to the degree of heat loss/heat transfer in the second direction.

A width of the first liner layer pattern 130A and a width of the memory cell 120A in the first direction are substantially the same, while a width of the second liner layer pattern 160A may be greater than a width of the memory cell 120A in the second direction. Furthermore, in the second direction, the width of the second liner layer pattern 160A may be equal to or greater than a sum of the width of the memory cell 120A and the width of the first liner layer patterns 130A on both sidewalls of the memory cell 120A. This discrepancy in sizes may result from using different processes to form the first liner layer pattern 130A and the second liner layer pattern 160.

Furthermore, in the embodiment of FIG. 7A, the hole 180 may separate a pair of second liner layers 160 that are adjacent to each other in the first direction. That is, the hole 180 may overlap a pair of second liner layers 160 as well as the second insulating layer 170 between the pair of second liner layers 160. Accordingly, at least a portion of the second insulating layer 170, which is disposed in a region between adjacent memory cells 120A in the second direction, may be removed to form a plurality of second insulating layer patterns 170A. Here, the pair of second liner layers 160 that are separated by a hole 180 are two adjacent second liner layers 160 without a memory cell 120A between them in the first direction. The plurality of second insulating layer patterns 170A may also be separated from each other in the second direction by a hole 180. Accordingly, the second insulating layer patterns 170A may be located on opposite sides of the memory cell 120A with the second liner layer pattern 160A therebetween.

The second insulating layer patterns 170A positioned on both sides of a first memory cell 120A in the second direction may be spaced apart from the second insulating layer patterns 170A positioned on both sides of a second memory cell 120A adjacent to the first cell in the second direction. According to this embodiment, openings of the mask pattern for forming the hole 180 may be relatively large to facilitate mask and the etching processes. However, the present disclosure is not limited to this embodiment, and in other embodiments a reduction in heat transfer may be provided by a hole 180 that separates the second liner layer 160. Such an embodiment is described below with reference to FIGS. 9A and 9B.

In the embodiment of FIG. 7A, the hole 180 has a rectangle planar shape having a relatively long length in the first direction and a relatively short width in the second direction. In other embodiments, the planar shape of the hole 180 may have various forms, such as an ellipse having a long axis in the first direction, or the like. In addition, a width of the hole 180 may be slightly larger than a sum of widths of the two second liner layer patterns 160A and the second insulating layer pattern 170A therebetween in the first direction in order to provide complete separation between the second liner layer patterns 160A in the second direction. In this case, portions of the second liner layer 160 and the second insulating layer 170 may be removed when the hole 180 is formed, and portions of the first insulating layer patterns 140A located on both sides of the hole 180 in the first direction may also be removed.

As seen in FIG. 7B, all of the second liner layer 160 and the second insulating layer 170 may be removed in a vertical direction during etching to form the hole 180. That is, in the cross-sectional view taken along the line C-C' of FIG. 7B, the hole 180 extends to a depth that exposes the first line 110 by removing all of the second liner layer 160 and the second insulating layer 170. However, the depth of the hole 180 may be have different characteristics in other embodiments as long as a it extends to a depth equal to or lower than a lower surface of the variable resistance layer 127A. An embodiment in which a hole 180 has these characteristics will be described below with reference to FIGS. 10A and 10B.

In summary, the planar shape of the hole 180 may have different shapes as long as the second liner layer 160 is cut between the memory cells 120A in the second direction. In addition, the depth of the hole 180 may extend to a depth that is the same or lower than a lower surface of the variable resistance layer 127A.

Although not shown, in the state in which the process of FIGS. 6A and 6B is performed, a low-K material which is deposited in a peripheral circuit region outside of the cell region that includes memory cells 120 when the first insulating layer 140 and/or the second insulating layer 170 is deposited. The low-K material in the peripheral circuit region may not affect the characteristics of the memory cells 120A, and may cause process failure due to high hygroscopicity. Therefore, the low-K material in the peripheral circuit region may be removed using a mask that covers the region in which the memory cells 120A are arranged and exposes the peripheral circuit region. In an embodiment, the hole 180 may be formed by the same process that removes the low-K material in the peripheral circuit region. More specifically, the mask exposing the peripheral circuit region may further include openings exposing a region corresponding to the hole 180, and the second liner layer 160 and the second insulating layer 170 may be etched together in the process of etching the low-K material in the peripheral circuit region. Therefore, the forming of the hole 180 may be performed without performing an additional dedicated process.

Referring to FIGS. 8A and 8B, a third insulating layer 190 filling the hole 180 may be formed. The process of forming the third insulating layer 190 may be performed together with or separately from a process of depositing an insulating material in the peripheral circuit region.

The third insulating layer 190 may include a material whose thermal conductivity is lower than that of the second liner layer pattern 160A. Furthermore, the third insulating layer 190 may include a material whose thermal conductivity is equal to or greater than that of the first insulating layer pattern 140A and the second insulating layer pattern 170A. For example, the third insulating layer 190 may be formed of a low-K material, like the first insulating layer pattern 140A and the second insulating layer pattern 170A. Alternatively, for example, the third insulating layer 190 may include a silicon oxide such as $SiO_2$, like the insulating material in the peripheral circuit region. For reference, the first and second liner layer patterns 130A and 160A may include SiN having a K value of about 29, and the third insulating layer 190 may include $SiO_2$ having a K value of about 1.38.

The third insulating layer 190 may be interposed between the second liner layer patterns 160A in the second direction. In this case, since the third insulating layer 190 has a lower thermal conductivity than the second liner layer pattern 160A and an interface between the third insulating layer 190 and the second liner layer pattern 160A interferes with heat transfer, the heat loss/heat transfer path shown by arrow ③ in FIG. 6A may be blocked.

Furthermore, the third insulating layer 190 may be interposed between the second insulating layer patterns 170A in the second direction.

By the above-described processes, the memory devices as shown in FIGS. 8A and 8B may be obtained.

Referring again to FIGS. 8A and 8B, an embodiment of a memory device may include the plurality of first lines 110 formed over the substrate 100 and extending in the first direction, the plurality of second lines 150 formed over the first lines 110 and extending in the second direction, and the plurality of memory cells 120A formed in the intersection regions of the first lines 110 and the second lines 150 between the first lines 110 and the second lines 150. Accordingly, the memory cells 120A may be arranged in a matrix form along the first direction and the second direction.

The first liner layer patterns 130A may be formed on both sidewalls of the memory cell 120A in the second direction, and the first insulating layer pattern 140A may be formed between the first liner layer patterns 130A. The second liner layer patterns 160A may be formed on both sidewalls of the memory cell 120A in the first direction, and the second insulating layer pattern 170A may be formed between the second liner layer patterns 160A.

Here, the third insulating layer 190 may be disposed between adjacent second liner layer patterns 160A in the second direction to separate them from each other. The third insulating layer 190 may be disposed between adjacent second insulating layer patterns 170A in the second direction to separate them from each other. In more detail, the third insulating layer 190 may separate a pair of second liner layer patterns that are 160A adjacent to each other in the first direction as well as the second insulating layer pattern 170A between the adjacent second liner layer patterns 160A.

Since the first insulating layer pattern 140A and the second insulating layer pattern 170A have a relatively low thermal conductivity, heat loss/heat transfer from the memory cell 120A through the first insulating layer pattern 140A and the second insulating layer pattern 170A may be reduced and/or blocked.

Although the second liner layer pattern 160A has a relatively high thermal conductivity, the third insulating layer 190 having a relatively low thermal conductivity may be interposed between the second liner layer patterns 160A in the second direction. Therefore, heat loss/heat transfer from the memory cell 120A through the second liner layer pattern 160A may also be reduced and/or blocked.

As a result, operating characteristics during operation of the memory device may be improved. For example, an operating current such as a reset current may be reduced, and thermal disturbance may be prevented.

A detailed description of the components of the memory device has already been made in the process of describing the manufacturing method, and thus will be omitted.

Figure 9A:
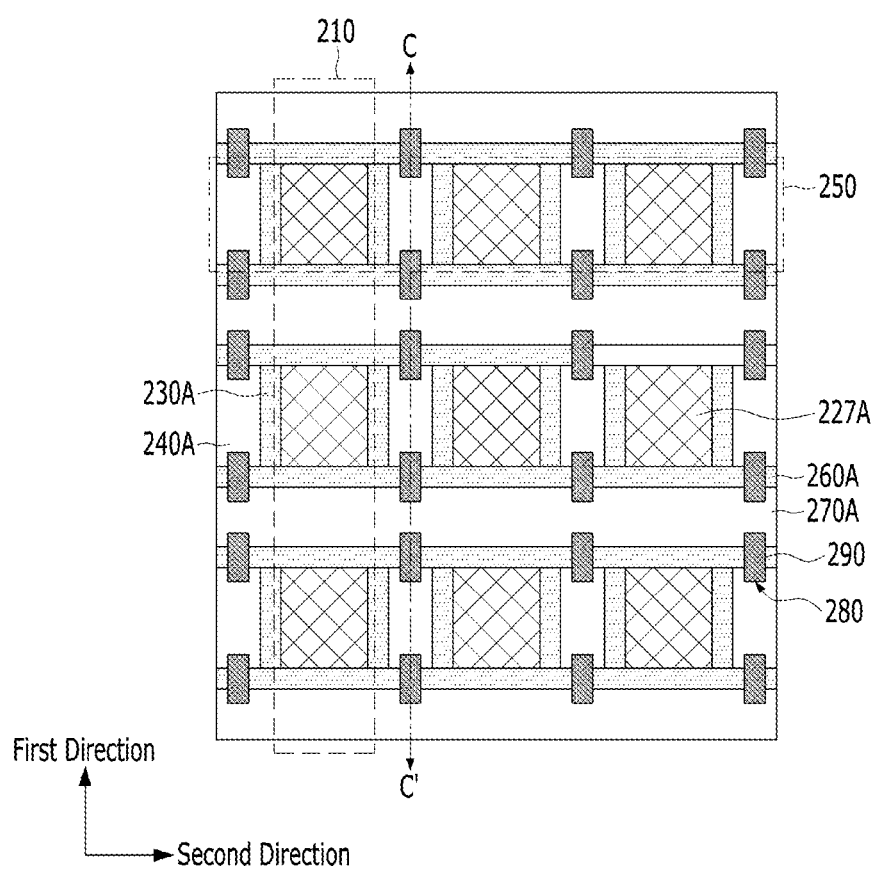
FIGS. 9A and 9B are a plan view and a cross-sectional view illustrating a memory device according to another embodiment of the present disclosure.
Figure 9B:
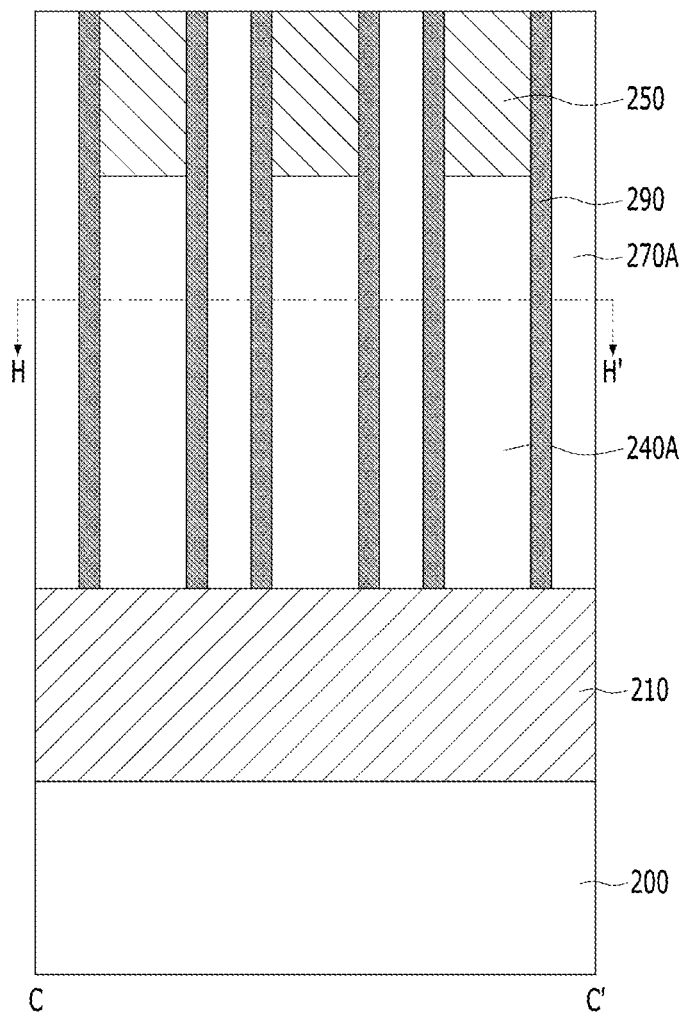

FIGS. 9A and 9B are a plan view and a cross-sectional view illustrating a memory device according to another embodiment of the present disclosure. Therefore, the following description focuses on features that are different from the previously described embodiments.

Referring to FIGS. 9A and 9B, by processes substantially the same as the processes described in FIGS. 1A to 6B, a structure including a substrate 200, first lines 210, memory cells including variable resistance layers 227A, first liner layer patterns 230A, first insulating layer patterns 240A, second lines 250, second liner layers, and second insulating layers may be obtained.

Subsequently, holes 280 overlapping the second liner layer may be formed to separate the second liner layer into a plurality of second liner layer patterns 260A. A third insulating layer 290 may fill the holes 280.

Here, a shape of the hole 280 is different from a shape of the hole 180. Accordingly, shapes of the second insulating layer pattern 270A and the third insulating layer 290, which interface with the hole 280, are different from the shapes of the second insulating layer pattern 170A and the third insulating layer 190 described above.

In the embodiment of FIGS. 9A and 9B, the holes 280 may be formed to separate the second liner layers into second liner layer patterns. Accordingly, the plurality of second liner layer patterns 260A are separated from each other in the second direction by the holes 280 and the third insulating layer 290, while the second insulating layer pattern 270A may have a line shape extending in the second direction.

In this embodiment, planar areas of the hole 280 and the third insulating layer 290 may be smaller than planar areas of the hole 180 and the third insulating layer 190 described above. In addition, planar shapes of the hole 280 and the third insulating layer 290 are illustrated as a rectangular shape. But the present disclosure is not limited thereto, and the planar shapes of the hole 280 and the third insulating layer 290 may vary between embodiments. For example, the planar shapes of the hole 280 and the third insulating layer 290 may be a square shape, a circular shape, an oval shape, or the like. In addition, for complete separation between the second liner layer patterns 260A in the second direction, widths of the hole 280 and the third insulating layer 290 may be slightly larger than a width of the second liner layer pattern 260A in the first direction. In this case, when the hole 280 is formed, a portion of the second liner layer may be removed, and portions of the first insulating layer pattern 240A and the second insulating layer pattern 270A positioned at both sides of the hole 280 in the first direction may also be removed.

When these processes are performed, the heat loss/heat transfer path illustrated by arrow ③ in FIG. 6A may be blocked. Therefore, embodiments described with respect to FIGS. 9A-B can block heat transfer between adjacent cells to the same or a similar degree to embodiments described with respect to FIGS. 8A-B.

Figure 10A:
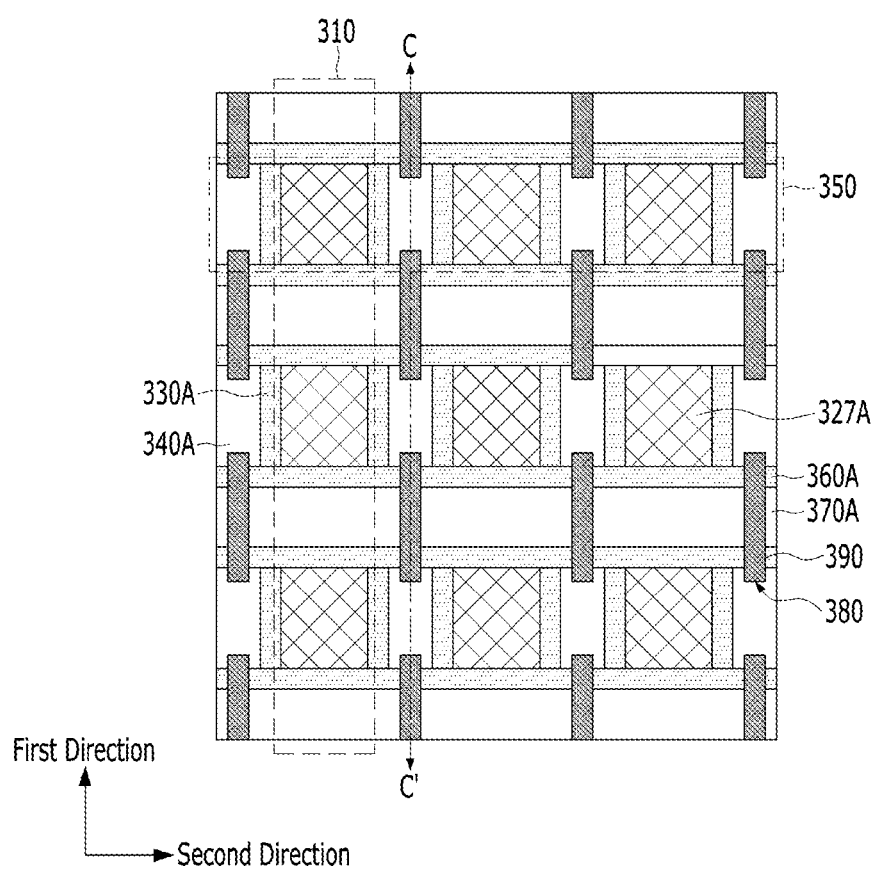
FIGS. 10A and 10B are a plan view and a cross-sectional view illustrating a memory device according to another embodiment of the present disclosure.
Figure 10B:
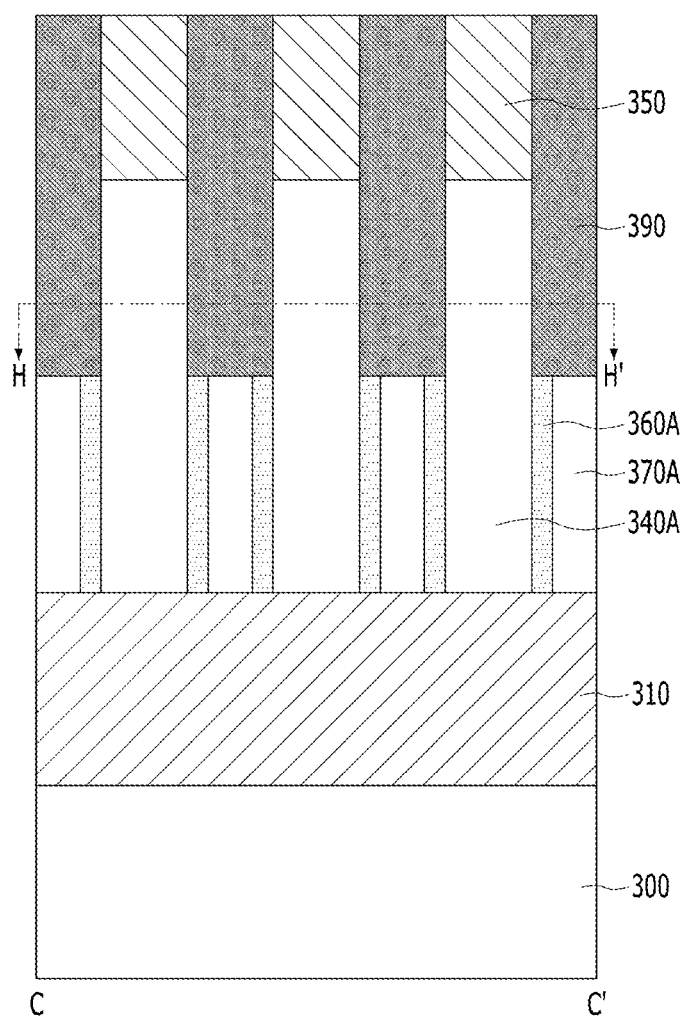

FIGS. 10A and 10B are a plan view and a cross-sectional view illustrating a memory device according to another embodiment of the present disclosure. Therefore, the following description focuses on features that are different from the previously described embodiments.

Referring to FIGS. 10A and 10B, a structure including a substrate 300, first lines 310, memory cells including variable resistance layers 327A, first liner layer patterns 330A, first insulating layer patterns 340A, second lines 350, second liner layers, and second insulating layers, may be obtained by performing the same as the processes described in FIGS. 1A to 6B.

Subsequently, holes 380 overlapping the second liner layer may be formed. A third insulating layer 390 may fill the hole 380.

Here, at the height of the line H-H', that is, at the height of the variable resistance layer 327A, planar shapes of the hole 380, the second insulating layer pattern 370A and the third insulating layer 390 may be the same as the planar shapes of the hole 180, the second insulating layer pattern 170A and the third insulating layer 190 described above. That is, a mask pattern for forming the hole 380 may be the same as the mask pattern for forming the hole 180.

On the other hand, a depth of the hole 380 may be less than the depth of the hole 180, as long as a lower surface of the hole 380 is lower than or equal to a lower surface of the variable resistance layer 327A. Accordingly, the second liner layer pattern 360A may be divided into a plurality of portions in the second direction at a height corresponding to the variable resistance layer 327A, while having a line shape extending in the second direction at a height below the variable resistance layer 327A. Similarly, the second insulating layer pattern 370A may be divided into a plurality of portions in the second direction at the height corresponding to the variable resistance layer 327A, while having a line shape extending in the second direction at the height below the variable resistance layer 327A.

The third insulating layer 390 filling the hole 380 may have a lower surface lower than or equal to the lower surface of the variable resistance layer 327A, and the second insulating layer pattern 370A and the second liner layer pattern 360A may be disposed under the third insulating layer 390.

When these processes are performed, the heat loss path/ the heat transfer path illustrated by arrow ③ in FIG. 6A may be blocked at the height of the variable resistance layer 327A. Therefore, a substantially identical/similar effect to the above-described embodiments may be obtained.

The above and other memory circuits or semiconductor devices based on the disclosed technology can be used in a range of devices or systems. FIGS. 11-14 provide some examples of devices or systems that can implement the memory circuits disclosed herein.

Figure 11:
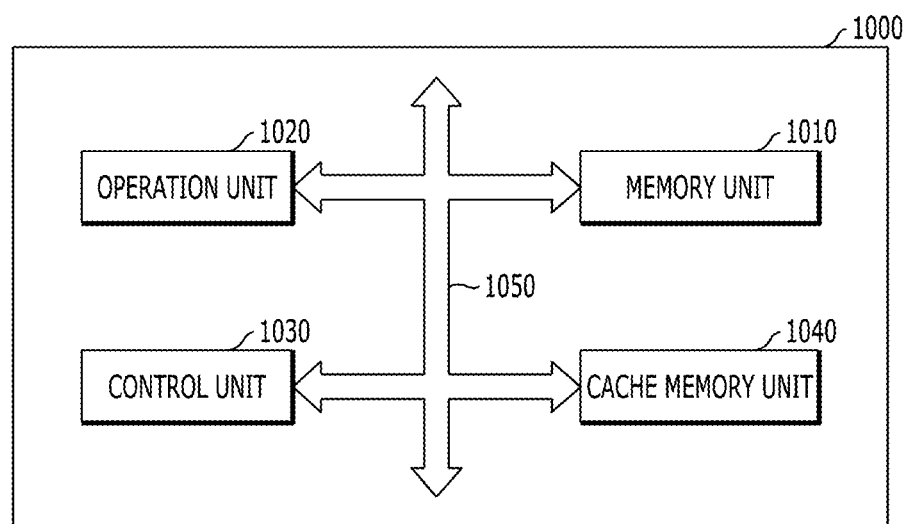
FIG. 11 is an example of configuration diagram of a microprocessor implementing memory circuitry based on the disclosed technology.

FIG. 11 is an example of configuration diagram of a microprocessor implementing memory circuitry based on the disclosed technology.

Referring to FIG. 11, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include various registers such as a data register, an address register, a floating point register and so on. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the embodiments. For example, the memory unit 1010 may include a plurality of first lines extending in a first direction; a plurality of second lines disposed over the first lines, the second lines extending in a second direction crossing the first direction; a plurality of memory cells disposed between the first lines and the second lines at intersection regions of the first lines and the second lines; first liner layer patterns positioned on both sidewalls of each memory cell in the second direction; a first insulating layer pattern positioned between adjacent first liner layer patterns in the second direction; second liner layer patterns positioned on both sidewalls of each memory cell in the first direction; a second insulating layer pattern positioned between adjacent second liner layer patterns in the first direction; and a third insulating layer positioned between adjacent second liner layer patterns in the second direction. Through this, in the memory unit 101, operating characteristics may be improved, and fabricating processes may be facilitated. As a consequence, it is possible to improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 12:
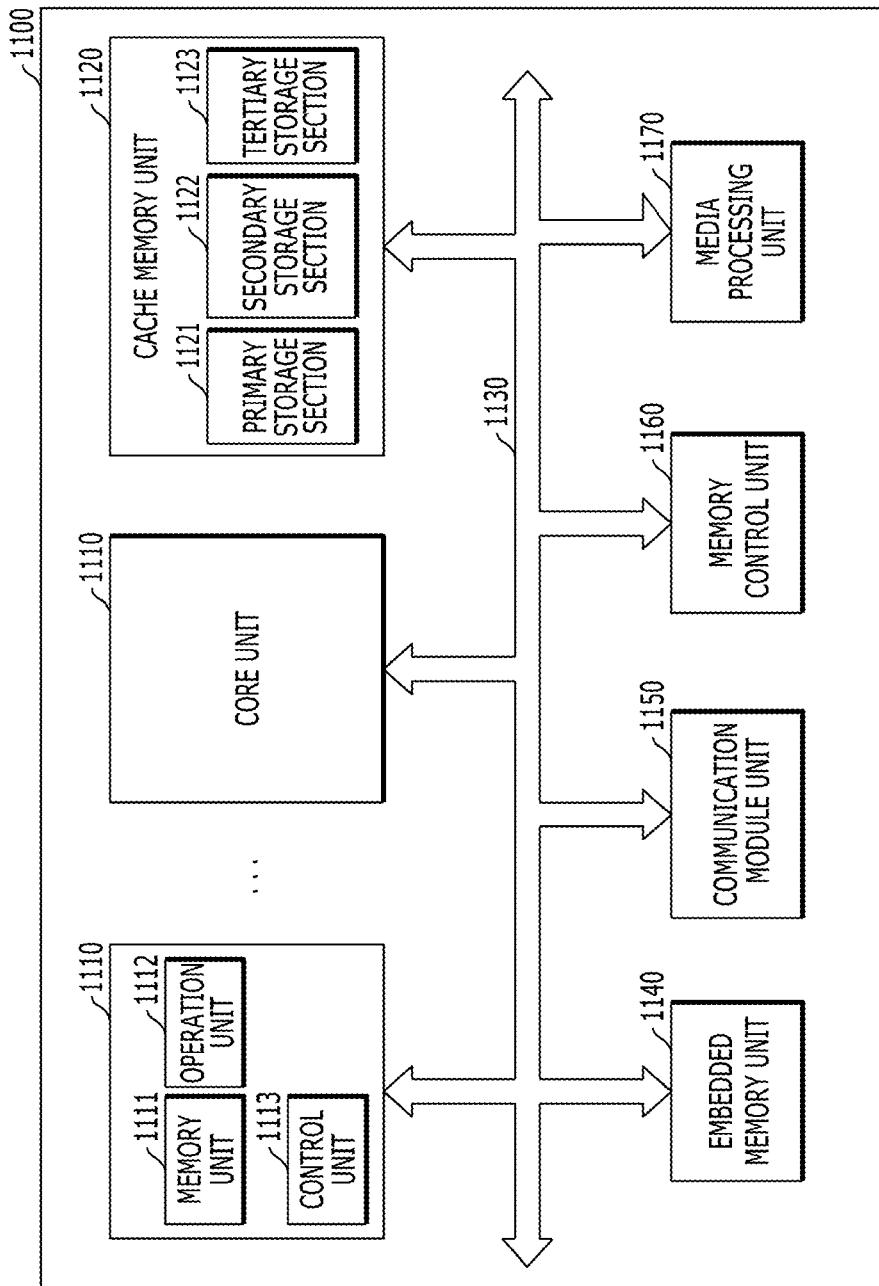
FIG. 12 is an example of configuration diagram of a processor implementing memory circuitry based on the disclosed technology.

FIG. 12 is an example of configuration diagram of a processor implementing memory circuitry based on the disclosed technology.

Referring to FIG. 12, a processor 1100 may improve performance and realize multi-functionality by including various functions other than those of the above-described microprocessor 1000. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present embodiment is a part which performs arithmetic logic operations for data inputted from an external device, and may include a memory unit 1111, an operation unit 1112 and a control unit 1113. The memory unit 1111, the operation unit 1112 and the control unit 1113 may be substantially the same as the memory unit 1010, the operation unit 1020 and the control unit 1030.

The cache memory unit 1120 is a part which temporarily stores data to compensate for a difference in data processing speed between the core unit 1110 operating at a high speed and an external device operating at a low speed. The cache memory unit 1120 may include a primary storage section 1121 and a secondary storage section 1122. Further, the cache memory unit 1120 may include a tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include a plurality of first lines extending in a first direction; a plurality of second lines disposed over the first lines, the second lines extending in a second direction crossing the first direction; a plurality of memory cells disposed between the first lines and the second lines at intersection regions of the first lines and the second lines; first liner layer patterns positioned on both sidewalls of each memory cell in the second direction; a first insulating layer pattern positioned between adjacent first liner layer patterns in the second direction; second liner layer patterns positioned on both sidewalls of each memory cell in the first direction; a second insulating layer pattern positioned between adjacent second liner layer patterns in the first direction; and a third insulating layer positioned between adjacent second liner layer patterns in the second direction. Through this, operating characteristics may be improved, and fabricating processes may be facilitated in the cache memory unit 1120. As a consequence, it is possible to improve operating characteristics of the processor 1100.

Although it was shown in this embodiment that all the primary, secondary and tertiary storage sections 1121, 1122 and 1123 are configured inside the cache memory unit 1120, at least one of the primary, secondary and tertiary storage sections 1121, 1122 and 1123 of the cache memory unit 1120 may be configured outside the core unit 1110 and may compensate for a difference in data processing speed between the core unit 1110 and the external device.

The bus interface 1130 is a part which connects the core unit 1110, the cache memory unit 1120 and external device and allows data to be efficiently transmitted.

The processor 1100 according to the present embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. Storage sections in each of the core units 1110 may be configured to be shared with storage sections outside the core units 1110 through the bus interface 1130.

The processor 1100 according to the present embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 13:
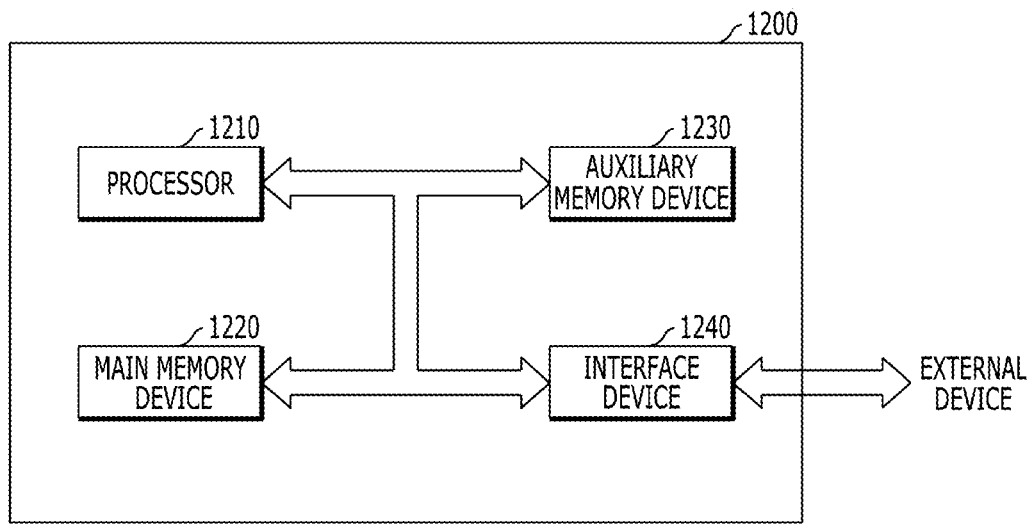
FIG. 13 is an example of configuration diagram of a system implementing memory circuitry based on the disclosed technology.

FIG. 13 is an example of configuration diagram of a system implementing memory circuitry based on the disclosed technology.

Referring to FIG. 13, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may substantially the same as the above-described microprocessor 1000 or the above-described processor 1100.

The main memory device 1220 is a storage which can temporarily store, call and execute program codes or data from the auxiliary memory device 1230 when programs are executed and can conserve memorized contents even when power supply is cut off. The auxiliary memory device 1230 is a memory device for storing program codes or data. While the speed of the auxiliary memory device 1230 is slower than the main memory device 1220, the auxiliary memory device 1230 can store a larger amount of data. The main memory device 1220 or the auxiliary memory device 1230 may include one or more of the above-described semiconductor devices in accordance with the embodiments. For example, the main memory device 1220 or the auxiliary memory device 1230 may include a plurality of first lines extending in a first direction; a plurality of second lines disposed over the first lines, the second lines extending in a second direction crossing the first direction; a plurality of memory cells disposed between the first lines and the second lines at intersection regions of the first lines and the second lines; first liner layer patterns positioned on both sidewalls of each memory cell in the second direction; a first insulating layer pattern positioned between adjacent first liner layer patterns in the second direction; second liner layer patterns positioned on both sidewalls of each memory cell in the first direction; a second insulating layer pattern positioned between adjacent second liner layer patterns in the first direction; and a third insulating layer positioned between adjacent second liner layer patterns in the second direction. Through this, operating characteristics may be improved, and fabricating processes may be facilitated in the main memory device 1220 or the auxiliary memory device 1230. As a consequence, it is possible to improve operating characteristics of the system 1200.

Also, the main memory device 1220 or the auxiliary memory device 1230 may include a memory system (see the reference numeral 1300 of FIG. 14) in addition to the above-described semiconductor device or without including the above-described semiconductor device.

The interface device 1240 may be to perform exchange of commands and data between the system 1200 of the present embodiment and an external device. The interface device 1240 may be a keypad, a keyboard, a mouse, a speaker, a mike, a display, various human interface devices (HIDs), a communication device, and so on. The communication device may be substantially the same as the above-described communication module unit 1150.

Figure 14:
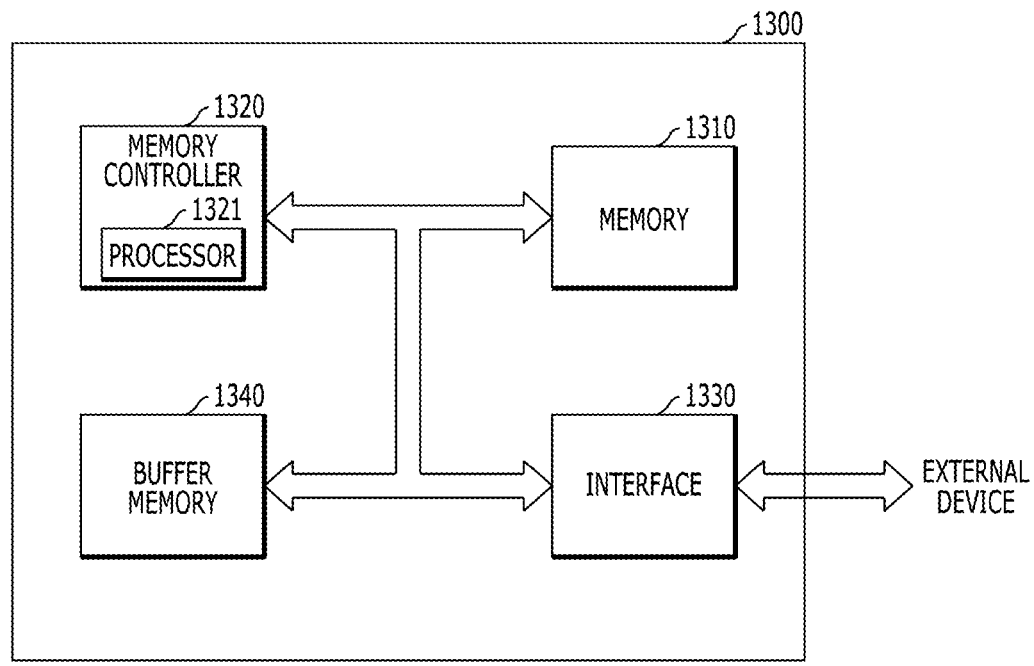
FIG. 14 is an example of configuration diagram of a memory system implementing memory circuitry based on the disclosed technology.

FIG. 14 is an example of configuration diagram of a memory system implementing memory circuitry based on the disclosed technology.

Referring to FIG. 14, a memory system 1300 may include a memory 1310 which has a nonvolatile characteristic as a component for storing data, a controller 1320 which controls the memory 1310, an interface 1330 for connection with an external device, and a buffer memory 1340 for storing data temporarily for efficiently transferring data between the interface 1330 and the memory 1310. The memory system 1300 may simply mean a memory for storing data, and may also mean a data storage device for conserving stored data in a long term. The memory system 1300 may be a disk type such as a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1310 or the buffer memory 1340 may include one or more of the above-described semiconductor devices in accordance with the embodiments. For example, the memory 1310 or the buffer memory 1340 may include a plurality of first lines extending in a first direction; a plurality of second lines disposed over the first lines, the second lines extending in a second direction crossing the first direction; a plurality of memory cells disposed between the first lines and the second lines at intersection regions of the first lines and the second lines; first liner layer patterns positioned on both sidewalls of each memory cell in the second direction; a first insulating layer pattern positioned between adjacent first liner layer patterns in the second direction; second liner layer patterns positioned on both sidewalls of each memory cell in the first direction; a second insulating layer pattern positioned between adjacent second liner layer patterns in the first direction; and a third insulating layer positioned between adjacent second liner layer patterns in the second direction. Through this, in the memory 1310 or the buffer memory 1340, operating characteristics may be improved, and fabricating processes may be facilitated. As a consequence, it is possible to improve operating characteristics of the memory system 1300.

The memory 1310 or the buffer memory 1340 may include various memories such as a nonvolatile memory or a volatile memory, in addition to the above-described semiconductor device or without including the above-described semiconductor device.

The controller 1320 may control exchange of data between the memory 1310 and the interface 1330. To this end, the controller 1320 may include a processor 1321 for performing an operation for, processing commands inputted through the interface 1330 from an outside of the memory system 1300 and so on.

The interface 1330 is to perform exchange of commands and data between the memory system 1300 and the external device. In the case where the memory system 1300 is a card type or a disk type, the interface 1330 may be compatible with interfaces which are used in devices having a card type or a disk type, or be compatible with interfaces which are used in devices similar to the above mentioned devices. The interface 1330 may be compatible with one or more interfaces having a different type from each other.

Features in the above examples of electronic devices or systems in FIGS. 11-14 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Other embodiments, enhancements and variations can be made based on what is described and illustrated in this patent document.

What is claimed is:

1. An electronic device comprising a semiconductor memory, the semiconductor memory comprising:
   a plurality of first lines disposed over a substrate and extending in a first direction which is parallel to a surface of the substrate;
   a plurality of second lines disposed over the first lines, the second lines extending in a second direction which is parallel to the surface of the substrate and crosses the first direction;
   a plurality of memory cells disposed between the first lines and the second lines at intersection regions of the first lines and the second lines;
   first liner layer patterns positioned on both sidewalls of each memory cell in the second direction and including a first insulating material;
   a first insulating layer pattern positioned between adjacent first liner layer patterns in the second direction;
   second liner layer patterns positioned on both sidewalls of each memory cell in the first direction and including a second insulating material;
   a second insulating layer pattern positioned between adjacent second liner layer patterns in the first direction; and
   a third insulating layer positioned between adjacent second liner layer patterns in the second direction.

2. The electronic device according to claim 1, wherein a width of each of the first liner layer patterns is equal to a width of each of the memory cells in the first direction, and a width of each of the second liner layer patterns is greater than a width of each of the memory cells in the second direction.

3. The electronic device according to claim 2, wherein the second liner layer patterns contact the first liner layer patterns in the second direction.

4. The electronic device according to claim 1, wherein a thermal conductivity of the third insulating layer is less than a thermal conductivity of each of the second liner layer patterns.

5. The electronic device according to claim 1, wherein thermal conductivities of the first insulating layer pattern and the second insulating layer pattern are less than thermal conductivities of the first liner layer patterns and the second liner layer patterns.

6. The electronic device according to claim 1, wherein a thermal conductivity of the third insulating layer is greater than or equal to thermal conductivities of the first and second insulating layer patterns, and less than thermal conductivities of the first and second liner layer patterns.

7. The electronic device according to claim 6, wherein the first and second liner layer patterns include silicon nitride, the third insulating layer includes silicon oxide, and the first and second insulating layer patterns include a low-K material having a K value of less than 0.04 W/mK.

8. The electronic device according to claim 1, wherein, in the first direction, a width of the third insulating layer is greater than a width of each of the second liner layer patterns.

9. The electronic device according to claim 1, wherein the third insulating layer is further positioned between adjacent second insulating layer patterns in the second direction.

10. The electronic device according to claim 1, wherein the third insulating layer extends across a pair of the second liner layer patterns adjacent to each other in the first direction and the second insulating layer pattern between the pair of second liner layer patterns.

11. The electronic device according to claim 10, wherein, in the first direction, a width of the third insulating layer is greater than a sum of widths of the pair of the second liner layer patterns and the second insulating layer pattern between the pair of second liner layer patterns.

12. The electronic device according to claim 1, wherein the second insulating layer pattern extends in the second direction.

13. The electronic device according to claim 1, wherein each of the memory cells includes two or more layers stacked in a vertical direction, and
   one of the two or more layers includes a variable resistance layer.

14. The electronic device according to claim 13, wherein the variable resistance layer includes a phase change material.

15. The electronic device according to claim 13, wherein a lower surface of the third insulating layer is positioned at a height below a lower surface of the variable resistance layer.

16. The electronic device according to claim 1, wherein a lower surface of the third insulating layer is positioned at a height equal to a height of an upper surface of each of the first lines.

17. The electronic device according to claim 1, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory is part of the memory unit in the microprocessor.

18. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

19. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

20. The electronic device according to claim 1, further comprising a memory system which includes:

a memory configured to store data and conserve stored data regardless of power supply;

a memory controller configured to control input and output of data to and from the memory according to a command inputted from an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

* * * * *